United States Patent [19]

Inoue

[11] Patent Number: 4,827,449
[45] Date of Patent: May 2, 1989

[54] SEMICONDUCTOR DEVICE

[75] Inventor: Hiroshi Inoue, Tokyo, Japan

[73] Assignee: OKI Electric Industry Co., Ltd., Tokyo, Japan

[21] Appl. No.: 62,428

[22] Filed: Jun. 16, 1987

[30] Foreign Application Priority Data

Jun. 27, 1986 [JP] Japan .................. 61-149403

[51] Int. Cl.⁴ .............................................. G11C 13/00
[52] U.S. Cl. ......................................... 365/63; 365/51
[58] Field of Search .................. 365/51, 63, 189, 230

[56] References Cited

U.S. PATENT DOCUMENTS 4,464,734 8/1984 McElroy .............................. 365/51
4,694,428 9/1987 Matsumura ........................ 365/51

FOREIGN PATENT DOCUMENTS 167361 8/1985 Japan .

OTHER PUBLICATIONS

IEEE Journal of Solid-State Circuits, vol. SC-20, No. 5, Oct. 1985, pp. 903-907, "A 1-Mbit CMOS DRAM with Fast Page Mode and Static Column Mode," Saito et al.

Primary Examiner—Terrell W. Fears
Attorney, Agent, or Firm—Spencer & Frank

[57] ABSTRACT

In semiconductor device having a memory cell array provided with a plurality of word lines extending in parallel with each other, each of the word lines includes a main word line extending throughout the entire length of the word line, and a auxiliary word line extending along and over part only of the word line. The auxiliary word lines of the adjacent word lines are staggered and do not overlap lengthwise.

19 Claims, 5 Drawing Sheets

SEMICONDUCTOR DEVICE

BACKGROUND OF THE INVENTION

The present invention relates to a semiconductor device, such as a random access memory (RAM), particularly a word line configuration of a memory cell array therein.

An example of a DRAM (dynamic RAM) is shown in IEEE Journal of Solid State Circuits, Vol. SC-20, No. 5, Oct. 1985, pp. 903-907, particularly FIG. 1 in page 904, therein.

The DRAM comprises a plurality of memory cells arranged in a matrix, a plurality of bit lines for transferring data in and out of the memory cells, and a plurality of word lines intersecting orthogonally with the bit lines for selecting the memory cells.

The word lines are selectively raised to a high potential to enable writing and reading of data in and out of the memory cells connected to the selected word line.

The operating speed in writing and reading is an important factor determining the performance of the DRAM. The resistance of the bit lines and the word lines should therefore be small.

In the above-referenced publication, the bit lines are made of a polycide layer (combination of polysilicon layer and silicide layer stacked on it), while the word lines are made of a polysilicon layer and a separate aluminum layer. More specifically, main word lines are formed of the polysilicon layer and auxiliary word lines are formed of the aluminum layer. The auxiliary word lines extend over and along the main word lines and connected with the main word lines by contacts provided at certain intervals.

The above-described configuration of the word lines has the following problems, which will be explained with reference to FIGS. 1, 2 and 3.

FIG. 1 shows a chip architecture of an example of DRAM. The chip surface comprises an area 21 for a row decoder, an area 22 for a column decoder and sense amplifiers, and areas 23 for blocks of memory cell array. In the illustrated example, the memory cell array is divided into four blocks. Only one of a plurality of word lines 24 and only one of a plurality of bit lines 25 are illustrated.

FIGS. 2 and 3 show how the word lines 24 are configured relative to a substrate 31. As illustrated, each of the word lines 24 is made up of a main word line 34 (shown in solid line) and an auxiliary word line 34' (shown in dashed line) which is connected with the main word line 34 by means of contacts 36 formed at intervals.

As will be seen from FIGS. 2 and 3, the minimum width that can be achieved for the auxiliary word lines, which are formed of aluminum is larger than the minimum width that can be achieved for the main word lines formed of polysilicon. The spaces between the aluminum word lines must also be made larger to prevent short-circuitry. This is due to the fact that aluminum has larger grain size and also needs to be thicker than polysilicon, so that it is more difficult to realize fine pattern with aluminum than with polysilicon. Furthermore, hillocks develop relatively easily on aluminum, so that short-circuiting occurs more easily with aluminum lines. For instance, while the width and the space of the main word lines 34 can be made at 0.8 micrometers, auxiliary word lines must have a width of 1 micrometer and a space of 1.5 micrometers. That is, while the main word lines 34 can be made to a pitch of 1.6 micrometers, the auxiliary word lines 34' need to have a minimum pitch of 2.5 micrometers. Since the main word lines 34 and the auxiliary word lines 34' are used in pairs, the degree of integration is limited by the pitch of the auxiliary word lines 34'.

To overcome this problem it can be conceived to use a polycide layer in place of the polysilicon layer for the main word line 34 and eliminate the auxiliary word line 34'. The polycide layer has a resistance one order smaller than the polysilicon layer, but the sheet resistivity of the polycide is $2-3\Omega/\square$, for example. This will place a limit to the maximum length of the word line 34 that can be used. Because of the limit in the length of the word line 34, it may become necessary to increase the number of the blocks of 23 memory cell array. For instance, the memory cell array may be divided into eight blocks rather than four blocks as shown in FIG. 1. But when the number of blocks is increased, additional decoders are needed. As a result, the chip size is increased.

SUMMARY OF THE INVENTION

An object of the invention is to enable reduction in the resistance of the word lines and reduction in the pitch of word lines, thereby to enable increase in the degree of integration.

The invention is featured by auxiliary word lines that extend to cover part only of the corresponding main word lines and by staggered auxiliary word lines which do not overlap lengthwise with each other along adjacent main word lines.

Because the auxiliary word lines do not overlap lengthwise with each other along adjacent main word lines, it is possible to select the pitch of the main word lines as if there were no auxiliary word lines, so that the pitch can be determined based on the width of the main word lines and the necessary space between adjacent main word lines. Moreover, the overall resistance through the entire word line comprising the main and auxiliary word lines is smaller than if the word line consists of the main word line alone. If the auxiliary word line is formed of aluminum whose resistance is negligible, the overall resistance of the entire word line is approximately halved.

DETAILED DESCRIPTION OF THE PREFERRED EMBODIMENTS

Figure 4:
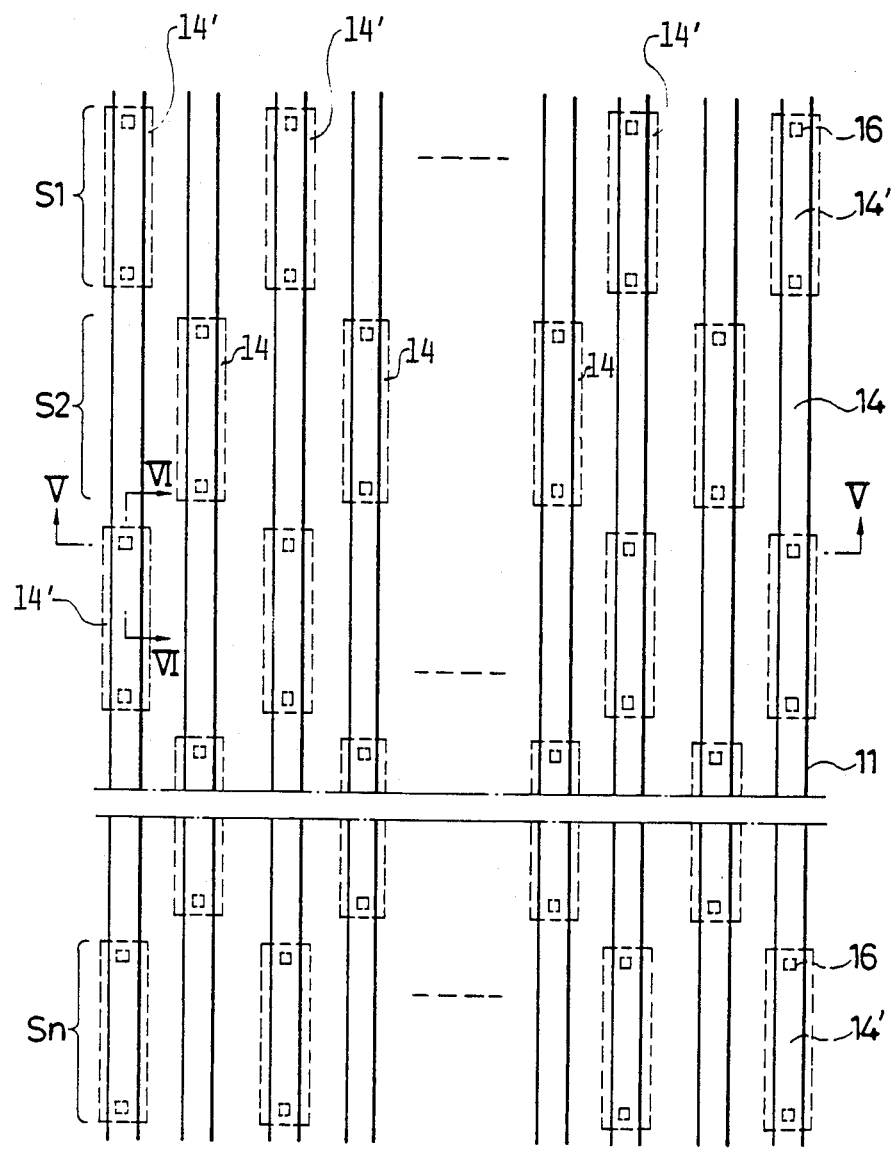
FIG. 4 is a plan view showing a DRAM, particularly its word line configuration, of an embodiment of the invention.
Figure 5:
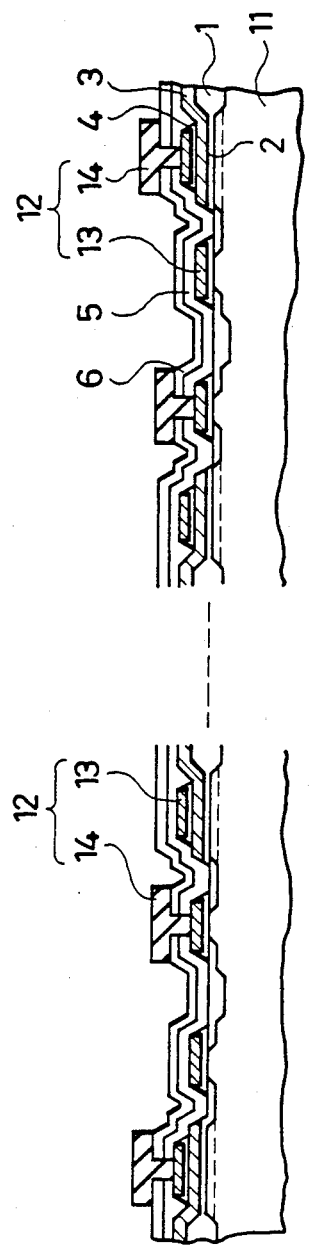
FIG. 5 is a cross sectional view, in an enlarged scale, along line V—V in FIG. 4.
Figure 6:
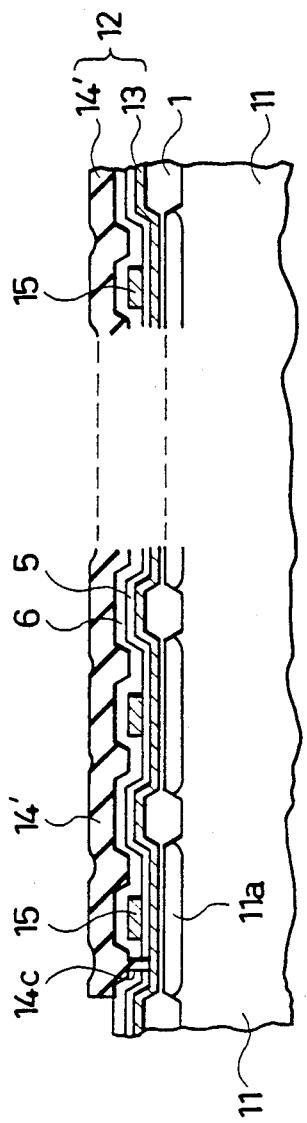
FIG. 6 is a longitudinal sectional view, in an enlarged scale taken along line VI—VI in FIG. 4.

Referring now more particularly to FIGS. 4, 5 and 6, there is shown a DRAM, and particularly its word line configuration.

The DRAM comprises memory cells, not shown, formed at a surface of a semiconductor substrate 11. A field oxide layer 1 and a gate oxide layer 2 are formed on the substrate 11. A polysilicon layer 3 consitituting gate electrodes and capacitor electrodes is formed on parts of the gate oxide layer 2. Doped regions 11a constituting drains and sources for transistors, and opposite electrodes of the capacitors are formed in the substrate 11. Memory cells formed of these transistors and capacitors are arranged in rows and columns, i.e., in a matrix (not shown).

Word lines are provided for respective rows. Memory cells of each row are connected to a single common word line provided for the particular row.

Figure 1:
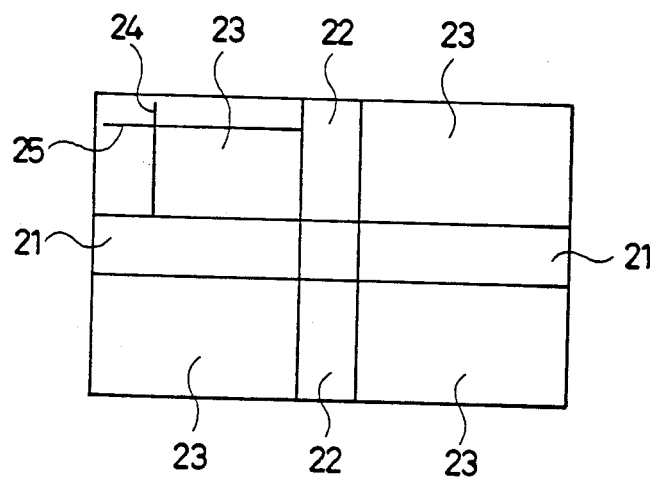
FIG. 1 is a plan view showing a chip architecture of an example of DRAM.
Figure 2:
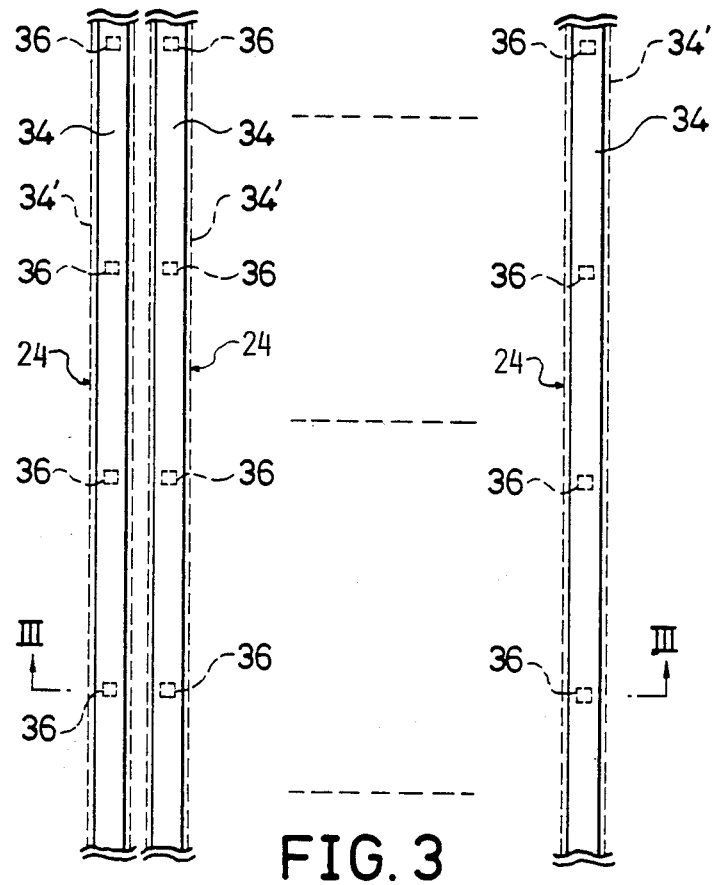
FIG. 2 is a plan view showing a prior art DRAM.
Figure 3:
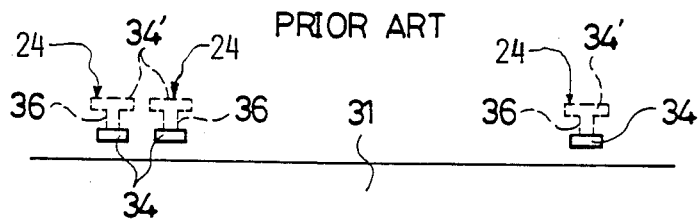
FIG. 3 is a cross sectional view taken along line III—III in FIG. 2.

Each word line 12 extends throughout the entire vertical length as viewed in FIG. 1 of each block.

Each word line 12 comprises a main word line 13 formed of a polycide layer and extending throughout the block and an auxiliary word line 14 extending to cover part only of the main word line 13. The auxiliary word line 14 is formed of material having lower resistance than the main word line 13. The material can be metal such as aluminum. The main word line 13 is formed on an insulating layer 4, which is formed on part of the polysilicon layer 3. The main word line 13 and the auxiliary word line 14 are separated by insulating layers 5 and 6 formed of glass or the like along most of their length, but are connected by contacts 14c provided at both ends of each piece of auxiliary word lines 14.

Bit lines 15 exending orthogonally to the word lines 12 do not appear in FIG. 5 since they pass at different positions along the direction of the length of the word lines 12.

The main word lines 13 are arranged in parallel at a minimum pitch which can be achieved. That is, the minimum pitch is determined by the minimum width of the main word lines 13 formed of the polycide layer and the minimum space between adjacent main word lines 13. The main word lines 13 extend throughout the entire block.

The auxiliary word lines 14 extend along and over the respective main word lines 13. The auxiliary word lines 14 cover part only of the corresponding main word lines 13, and the auxiliary word lines 14 are disposed relative to each other along adjacent main word lines 13 so as not to overlap lengthwise. In the illustrated examples the word lines are divided into sections S1, S2, ... Sn. Odd-numbered sections (e.g., S1), as counted from the top for example, of alternate word lines 12 are provided with the auxiliary word lines 14' (shown in FIG. 4), while even-numbered sections (e.g., S2) of intervening word lines 12 are provided with the auxiliary word lines 14, and other sections are not provided with the auxiliary word lines.

For example, all the sections may have equal lengths. But the invention does not preclude the possibility of providing sections of different lengths. But it is preferable that the total lengths of the parts of respective word lines provided with the auxiliary word lines are equal.

The greater the number of the sections into which the word lines are divided, the more uniform is the access speed of the memory cells. But, a practical limit to the uniformity is reached when the number of the sections is increased to eight where there are 1024 memory cells along each word line. This limit gives an optimum number of sections.

Moreover, clearances C are provided between ends of auxiliary word lines in adjacent sections along the adjacent word lines.

Because the auxiliary word lines are disposed relative to each other along adjacent word lines such that they are staggered and do not overlap lengthwise, no problem of short-circuiting between adjacent auxiliary word lines 14 will occur, even when the pitch of the word lines 12 is set at the value determined by the minimum space and width of the main word lines B. This is because there are no "adjacent" auxiliary word lines and the "pitch" of the auxiliary word lines is effectively made twice the pitch of the word lines.

As approximately half of the length of each word line 12 is provided with auxiliary word lines 14, the overall resistance of the entire word line 12 is reduced to approximately half (if the resistance of the auxiliary word line 14 can be neglected), compared with a situation where the word line 12 consists of the main word line 13 alone. Accordingly, it is not necessary to increase the number of the blocks of memory cell array. The invention thus contributes to increase in the degree of integration.

The invention is not limited to application to DRAM, but the invention can be applied to SRAM (static RAM), ROM (read only memory), EPROM (electrically programmable ROM), EEPROM (electrically erasable and programmable ROM) as well as to microcomputers incorporating these memories.

I claim:

1. A semiconductor device having a memory cell array provided with a plurality of word lines extending in parallel with one another, and wherein each of said word lines has a length and includes a main word line extending along the entire length of said word line and an auxiliary word line extending along and over only part of said word line, and wherein each said auxiliary word line of adjacent ones of said word lines are staggered such that adjacent ones of each said auxiliary word line do not overlap in lengthwise extent.

2. A device according to claim 1, wherein each said auxiliary word line is respectively connected by contacts to the corresponding ones of said main word lines.

3. A device according to claim 2, wherein each said auxiliary word line comprises auxiliary word line segments arranged along said main word line and which are separated from each other along said main word line by portions of said main word line where said auxiliary word line segments are not provided, each of said auxiliary word line segments have two ends, and respective ones of said contacts are disposed at each of said two ends of each of said auxiliary word line segments.

4. A device according to claim 1, wherein each said auxiliary word line is formed of a material having a smaller resistivity than that forming said main word line.

5. A device according to claim 4, wherein said main word line is formed of polycide.

6. A device according to claim 1, wherein each said auxiliary word line is formed of metal.

7. A device according to claim 1, wherein said memory array comprises sections which are divisions by imaginary lines orthogonal to said word lines, wherein odd-numbered sections of alternate ones of said word lines are provided with respective ones of each said auxiliary word line, wherein said alternate word lines are separated by intervening word lines, and even-numbered sections of said intervening word lines are provided with said auxiliary word line, such that respective ones of each said auxiliary word line are staggered with respect to the length dimension along adjacent word lines.

8. A device according to claim 7, wherein each of said sections have substantially equal dimension in the direction of said word lines.

9. A device according to claim 6, wherein each said auxiliary word line is formed of aluminum.

10. A device according to claim 4, wherein said main word lines are formed of polycide.

11. A device according to claim 4, wherein each said auxiliary word line is formed of metal.

12. A device according to claim 1, further comprising an insulating layer separating said main word line and a corresponding said auxiliary word line, and wherein each respective said auxiliary word line is connected to a respective one of said main lines by contacts disposed in openings through said insulating layer.

13. A device according to claim 1, wherein each said auxiliary word line has substantially the same length taken along with length direction of said word line.

14. A device according to claim 1, wherein said main word lines are formed of polycide and said auxiliary word line is formed of metal.

15. A device according to claim 1, wherein respective ones of each said auxiliary word line are respectively provided intermittently over each of said main word lines.

16. A device according to claim 3, wherein said contacts are provided only at each of said two ends of each of said auxiliary word line segments.

17. A semiconductor device including a memory cell array having a plurality of main word lines extending in parallel with one another, each of said main word lines including auxiliary word line segments extending periodically along and over said main word line, each of said auxiliary word line segments being connected at each end by contacts to said main word line, and wherein said auxiliary word line segments are staggered with respect to the length direction along adjacent ones of said main word lines such that said auxiliary word line sigments of adjacent ones of said main word lines do not overlap in lengthwise extent.

18. A semiconductor device as defined in claim 17, wherein approximately half the length of each said main word line is occupied by said auxiliary word line segments.

19. A semiconductor device as defined in claim 18, wherein said auxiliary word line segments are composed of aluminum, and said main word lines are composed of polycide.

* * * * *